United States Patent
Hashimoto

(10) Patent No.: US 7,377,306 B2
(45) Date of Patent: May 27, 2008

(54) RADIATION FIN, COOLING DEVICE, ELECTRONIC EQUIPMENT, AND MANUFACTURING METHOD OF COOLING DEVICE

(75) Inventor: Toshio Hashimoto, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/637,090

(22) Filed: Dec. 12, 2006

(65) Prior Publication Data

US 2007/0084584 A1 Apr. 19, 2007

Related U.S. Application Data

(62) Division of application No. 10/994,456, filed on Nov. 23, 2004, now Pat. No. 7,165,601.

(30) Foreign Application Priority Data

Dec. 12, 2003 (JP) .............................. 2003-414322

(51) Int. Cl.
*H05K 7/20* (2006.01)
(52) U.S. Cl. ...................... 165/78; 165/80.3; 165/121; 165/104.33; 361/697
(58) Field of Classification Search .................. 165/78, 165/80.3, 104.33, 121, 185; 361/697, 704
See application file for complete search history.

(56) References Cited

U.S. PATENT DOCUMENTS 6,311,767 B1 * 11/2001 Inoue et al. ................. 361/697
6,340,056 B1 * 1/2002 Huang et al. ................ 165/185
6,607,023 B2 * 8/2003 Ho et al. ....................... 165/78
6,671,177 B1 * 12/2003 Han ............................ 361/697
6,752,201 B2 * 6/2004 Cipolla et al. ............... 165/121
6,754,079 B1 * 6/2004 Chang ......................... 165/185
6,789,609 B2 * 9/2004 Tsai et al. ...................... 165/78
6,842,342 B1 * 1/2005 Lin .............................. 361/697

FOREIGN PATENT DOCUMENTS

JP      2002-314009     10/2002

* cited by examiner

*Primary Examiner*—Leonard R Leo
(74) *Attorney, Agent, or Firm*—Rader Fishman & Grauer PLLC; Ronald P. Kananen

(57) ABSTRACT

Each of fins is provided with an engage projection having a first width and a engage hole portion having a second width wider than the first width, and the fins are able to be slid while engaging with each other. Accordingly, in case of installing a heat sink to a case of a fan, it is possible to install the fins to the case so that the fins are arranged in a flowing direction of a refrigerant by the fan while engaging with each other. As the result, the refrigerant is able to flow smoothly when passing through the fins by arranging the fins at desired angle. Accordingly, it becomes possible to present a radiation fin, a cooling device and an electronic equipment having such cooling device.

4 Claims, 12 Drawing Sheets

RADIATION FIN, COOLING DEVICE, ELECTRONIC EQUIPMENT, AND MANUFACTURING METHOD OF COOLING DEVICE

CROSS REFERENCE TO RELATED APPLICATIONS

The present application is a Divisional Application of the patent application No.: 10/994,456, filed Nov. 23, 2004, now U.S. Pat. No. 7,165,601, issued Jan. 23, 2007, which claims priority from Japanese application No. 414322 filed on Dec. 12, 2003, the entire contents of which are incorporated herein by reference.

BACKGROUND OF THE INVENTION

1. Field of the Invention

The present invention relates to a radiation fin for radiating heat generated from a heating element, a cooling device equipped with a radiation fin, electronic equipment equipped with a cooling device, and a manufacturing method of a cooling device.

2. Description of Related Art

As a device for cooling a heating element, such as a central processing unit (CPU), there has heretofore been proposed a heat sink such as a radiation fin. In a heat sink, heat radiation thereof is hastened by air blown by a fan, for example.

This heat sink is constructed by stacking a plurality of fin members. Specifically, a claw portion and an engage hole are respectively disposed in the individual fins, and the heat sink is constructed by attaching plural fins to a fan case, or the like in the state in which the claw portions of the respective fins are engaged with the engage holes of the adjacent fins (for example, see a patent document 1: Japanese Laid-Open Patent No. 2002-314009).

However, for example, when a heat sink 205 described in the Patent Document 1 is attached to an air outlet 203a of a case 203 of a fan 210 as shown in FIG. 20, the following problems arise. For example, the flow of air generated by the rotation of an impeller 206 disposed in the fan case 203 has a certain angle to the longitudinal direction of the heat sink 205, and hence the air cannot flow through smoothly between the respective fins 202 of the heat sink 205. This causes not only a drop in a heat radiation efficiency, but also the drawback of becoming a noise source because the air is blown with the certain angle to the respective fins 202.

In addition, for example, to achieve that the flow of air generated by the impeller 206 can pass through smoothly between the respective fins 202, it is necessary to fix the heat sink 205 so as to be offset rightward when viewed, in the figure, from a rotation center P of the impeller 206 as shown in FIG. 21. This has the disadvantage that a cooling device itself becomes larger, and this is not fit for miniaturization.

To solve these problems, there is a cooling device in which the heat radiation is done by smoothly passing the air generated by a fan with the use of a heat sink 207 that is given a curvature after being constructed by stacking fins 208, as shown in FIG. 22. To curve the heat sink 207, however, equipment and a jig for making an angle are required, which causes a cost increase.

SUMMARY OF THE INVENTION

In view of the foregoing circumstances, one of the aspects of the present invention is to provide a radiation fin that is able to increase a heat radiation efficiency or a cooling efficiency, and is high in cooling performance, as well as a cooling device, and an electronic equipment equipped with this cooling device.

Another aspect of the present invention is to provide a radiation fin that is able to reduce noise and to achieve miniaturization, a cooling device, and an electronic equipment equipped with this cooling device.

Another aspect of the present invention is to provide a manufacturing method of a cooling device, by which it is able to easily manufacture a radiation fin, and a cooling device equipped with a radiation fin.

A radiation fin of the present invention is a radiation fin that is equipped with a plurality of fins, each of which includes a plurality of engage projections disposed having a first width, and a plurality of engage hole portions that is disposed having a second width greater than the aforesaid first width, wherein it is possible for the engage hole portions to engage with the aforesaid engage projections of an adjacent fin.

In the present invention, the engage hole portions having the second width greater than the first width of the engage projections are disposed at each of the fins. Therefore, for example, the fins can be slid with each other while engaging with each other. Thereby, for example, when the radiation fin is attached to a case of the fan, etc., the fins can be attached so as to position along the direction of refrigerant flow through the fan, that is, obliquely at an arbitrary angle to the case, while the fins are being slid over each other. As a result, since the resistance when the refrigerant flow passes through between the respective fins can be reduced, the refrigerant flows smoothly to allow for improvement in the heat radiation efficiency. Additionally, noise can be reduced because the refrigerant flows smoothly between the respective fins. Further, miniaturization of the heat sink is attainable because there is no need for offsetting the installation position of the radiation fin with respect to the case, as has been conventional.

In accordance with one embodiment of the present invention, each of the aforesaid engage projections has flexibility. This facilitates easy engagement of the engage projection with the engage hole portion and also prevents to the utmost the respective fins from separating from each other.

In accordance with one embodiment of the present invention, the aforesaid engage projection has a surface in the shape of a curved surface or in the shape of a slant surface such that its height changes in substantially the width direction of the aforesaid first or second width. This facilitates the easy engagement of the engage projection with the engage hole portion.

In accordance with one embodiment of the present invention, each of the aforesaid fins includes an abutment projections that is disposed at the aforesaid engaged hole portion to lock the aforesaid respective fins with each other while engaging the aforesaid engage projections with the aforesaid engage hole portion. This enables easy engagement of the respective fins with each other in a first or second width direction, namely a slide direction, thereby preventing to the utmost the respective fins from separating from each other.

In accordance with one embodiment of the present invention, a plurality of the aforesaid abutment projections are disposed at each of the aforesaid fins. This allows for stepwise slide with the respective fins engaged to each other. Therefore, the array angle of the respective fins can be adjusted suitably and stepwise. As a result, for example, when the radiation fin is attached to a case of a fan, the angle of the radiation fin to the case can be adjusted suitably and stepwise.

In accordance with one embodiment of the present invention, each of the aforesaid abutment projections has a surface in the shape of a curved surface or in the shape of slant surface such that the height changes in substantially the width direction of the aforesaid first or second width. Thereby, when the angle of an array direction is adjusted by having the respective fins slide over each other, it is easy to have them slide.

In accordance with one embodiment of the present invention, each of the aforesaid respective fins has a plurality of bent regions that is bent in a predetermined length from each end portion, and each of the aforesaid engage projections is disposed so as to project outwardly from the aforesaid end portion, and each of the aforesaid engage hole portions is disposed at the aforesaid bent region. Alternatively, in accordance with one embodiment of the present invention, each of the aforesaid respective fins has a plurality of bent regions that is bent in a predetermined length from each end portion, and the aforesaid engage projection is disposed so as to project at a bending position of the bend region, and the aforesaid engage hole portion is disposed at the bent region. By disposing this bent region, the invention is able to form a predetermined spaced interval between the respective fins and further maintain satisfactorily the engage state between the respective fins.

A cooling device in accordance with the present invention includes a case having a suction port and an exhaust port, an impeller member that is encased in the aforesaid case and can exhaust refrigerant sucked into the aforesaid case via the aforesaid suction port in a first direction to outside of the aforesaid case via the aforesaid exhaust port, and a plurality of first fin groups that are arranged in the vicinity of the aforesaid exhaust port and are attached to the aforesaid case such that their respective surfaces are oriented in the aforesaid first direction and obliquely to the direction of arrangement.

In the present invention, the surface of each fin of the first fin groups are attached to the case so as to be oriented in the first direction and obliquely to the direction of arrangement. This enables a reduction in the resistance when the flow of refrigerant from the impeller member passes through between the respective fins, so that the refrigerant flows smoothly to allow for an improvement in the heat radiation efficiency. Additionally, noise can be reduced because the refrigerant flows smoothly between the respective fins. Further, miniaturization of the cooling device is attainable because there is no need for offsetting the installation position of the radiation fin with respect to the case, as has been conventional.

In accordance with one embodiment of the present invention, the aforesaid impeller member further includes a plurality of second fin groups, which can exhaust the aforesaid refrigerant in a second direction different from the aforesaid first direction, and arranged with plural number in the vicinity of the aforesaid exhaust port, and which are attached to the aforesaid case such that their respective surfaces are oriented in the aforesaid second direction. For example, depending on the shape, the size and the like of the impeller member or the case, the exhaust direction of refrigerant exhausted from the exhaust port may be different for different locations. In other words, the refrigerant may be exhausted in the first direction and the second direction, and hence by disposing the first fin groups and the second fin groups in response to this, the heat radiation efficiency or the cooling efficiency can be further improved.

A cooling device according to another viewpoint of the present invention includes a case having a suction port and an exhaust port, an impeller member that is encased in the aforesaid case and can exhaust refrigerant sucked into the aforesaid case via the aforesaid suction port to outside of the aforesaid case via the aforesaid exhaust port, and a plurality of fins which are disposed in the vicinity of the aforesaid exhaust port and are attached to the aforesaid case such that their directions are variable depending on an exhaust direction of the aforesaid refrigerant.

Since in the present invention a plurality of the fins are attached to the aforesaid case such that their directions are variable depending on the exhaust direction of refrigerant, the refrigerant flows smoothly and heat dissipation efficiency can be improved. Additionally, noise can be reduced because the refrigerant flows smoothly between the respective fins. Further, miniaturization of the cooling device is attainable because there is no need for offsetting the installation position of the radiation fin with respect to the case, as has been conventional. For example, the aforesaid respective fins are variable in their directions such that their respective surfaces are directed in the aforesaid exhaust direction.

An electronic equipment according to the present invention is an electronic equipment, which is provided with a radiation fin in which a plurality of fins are arranged and disposed, and which has a heating element, a case having a suction port and an exhaust port, a fan that is encased in the aforesaid case and has an impeller member which can exhaust refrigerant sucked into the aforesaid case via the aforesaid suction port in a predetermined direction to outside of the aforesaid case via the aforesaid exhaust port, engage projections respectively disposed in a first width at the aforesaid respective fins, and engage hole portions that are respectively disposed in a second width greater than the aforesaid first width at the respective fins and can be engaged to the aforesaid engage projections of adjacent fins, and the surfaces of the aforesaid respective fins are attached to the aforesaid case so as to be oriented in the aforesaid predetermined direction and oblique to an array direction, in order to dissipate the heat of the aforesaid heating element.

In the present invention, cooling treatment of a heating element to be mounted on an electronic equipment can be performed efficiently. As a heating element, an electronic equipment, such as IC chips and resistors, or a radiation fin, etc. may be cited. However, without limiting to these, an electronic equipment may be anything which generates heat. As an electronic equipment, computers, personal digital assistances (PDAs), and other electrical appliances, etc. may be cited. The same is true for the following.

A manufacturing method of a cooling device in accordance with the present invention is a manufacturing method of a cooling device, which has a case having a suction port and an exhaust port, an impeller member that is encased in the aforesaid case and can exhaust refrigerant sucked into the aforesaid case via the aforesaid suction port in a predetermined direction to outside of the aforesaid case via the aforesaid exhaust port, and a plurality of fins arranged and disposed in the vicinity of the aforesaid exhaust port, including, a step of engaging engage projections disposed respectively in a first width at the aforesaid fins to engage hole portions of adjacent fins that are disposed in a second width greater than the aforesaid first width at the aforesaid respective fins, a step of sliding the respective fins over each other with the respective engage projections engaged to the respective engage hole portions, and a step of attaching to the aforesaid case such that the surfaces of the aforesaid respective slid fins are oriented in the aforesaid predetermined direction and are oblique to an array direction.

Traditionally, to attach obliquely a radiation fin to a case as in the present invention, it is necessary to attach obliquely individual fins to the case. However, in the present invention the angle of individual fins can be set obliquely to the array direction of the respective fins only by having the respective fins slide over each other when the radiation fin is attached to a fan case. Therefore, after having them slide, the radiation fin can be attached to the case thereby to facilitate manufacturing.

Thus, in accordance with the present invention, the heat radiation efficiency or cooling efficiency can be improved, noise can be reduced, and miniaturization is attainable. In addition, a radiation fin and a cooling device equipped with a radiation fin can be manufactured easily.

DETAILED DESCRIPTION OF THE PREFERRED EMBODIMENTS

Preferred embodiments of the present invention will be described below based on the drawings.

Figure 1:
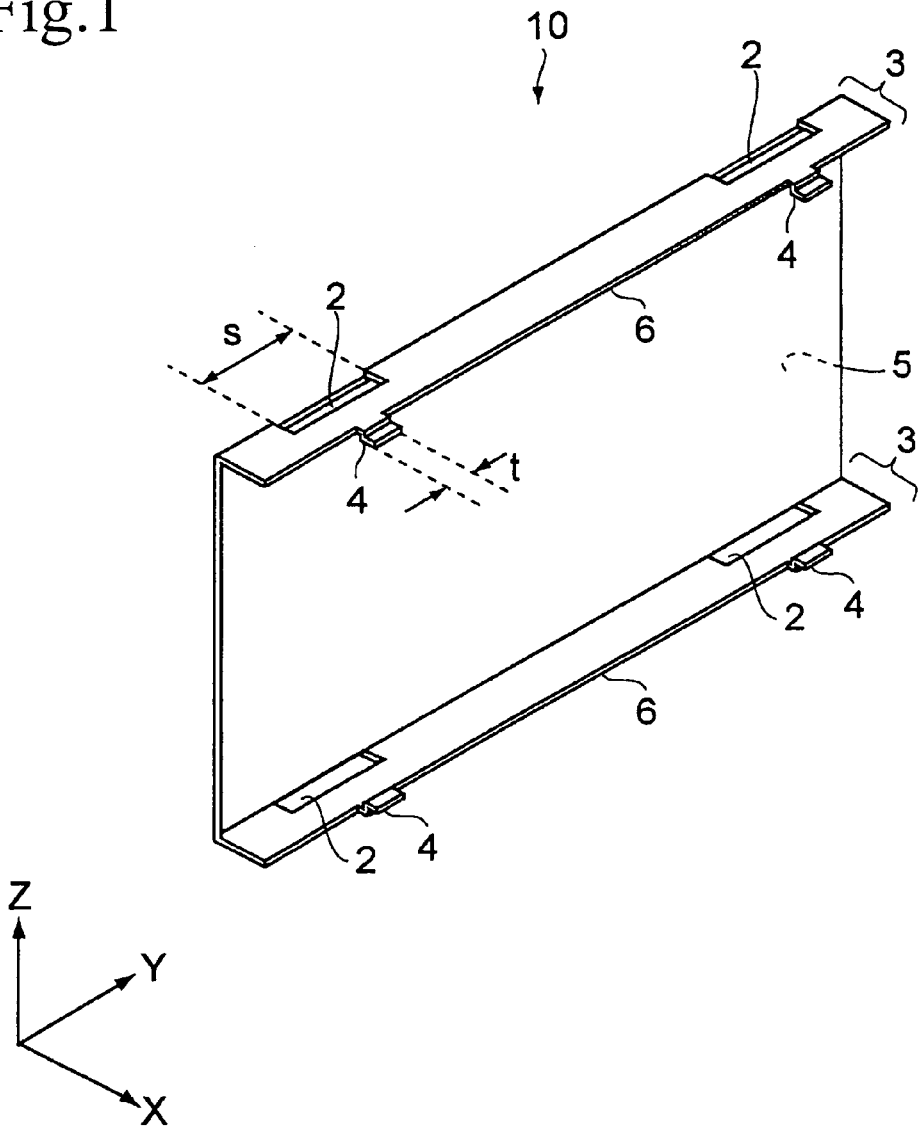
FIG. 1 is a perspective view showing a fin in accordance with one preferred embodiment of the present invention.

FIG. 1 is a perspective view showing a fin in accordance with one preferred embodiment of the present invention. A fin 10 is constructed by bending in a predetermined length from its end portion 6, and having a bent region 3. Herein, the predetermined length depends on the size of the fin 10, and should not be limited. For example, it may be 5 to 20% of a height direction of the fin 10 (the Z direction). The bent regions 3 are disposed at two locations. The end portion 6 is provided with engage projections 4, which may be four pieces, for example. The engage hole portions 2, which may be four pieces, for example, are disposed in the vicinity of the respective engage projections 4. A width s of the engage hole portion 2 is greater than a width t of the engage projection 4. Specifically, it is able to be formed so as to be, for example, s=2t to 5t, without being limited to this. The values of t and s are approximately the same in the four engage projections 4 and the four engage hole portions 2, respectively.

While metal such as copper and aluminum, etc. can be used as the material of the fin 10, without limiting to these, high-thermal conductance fibers, such as carbon may be used.

Figure 2:
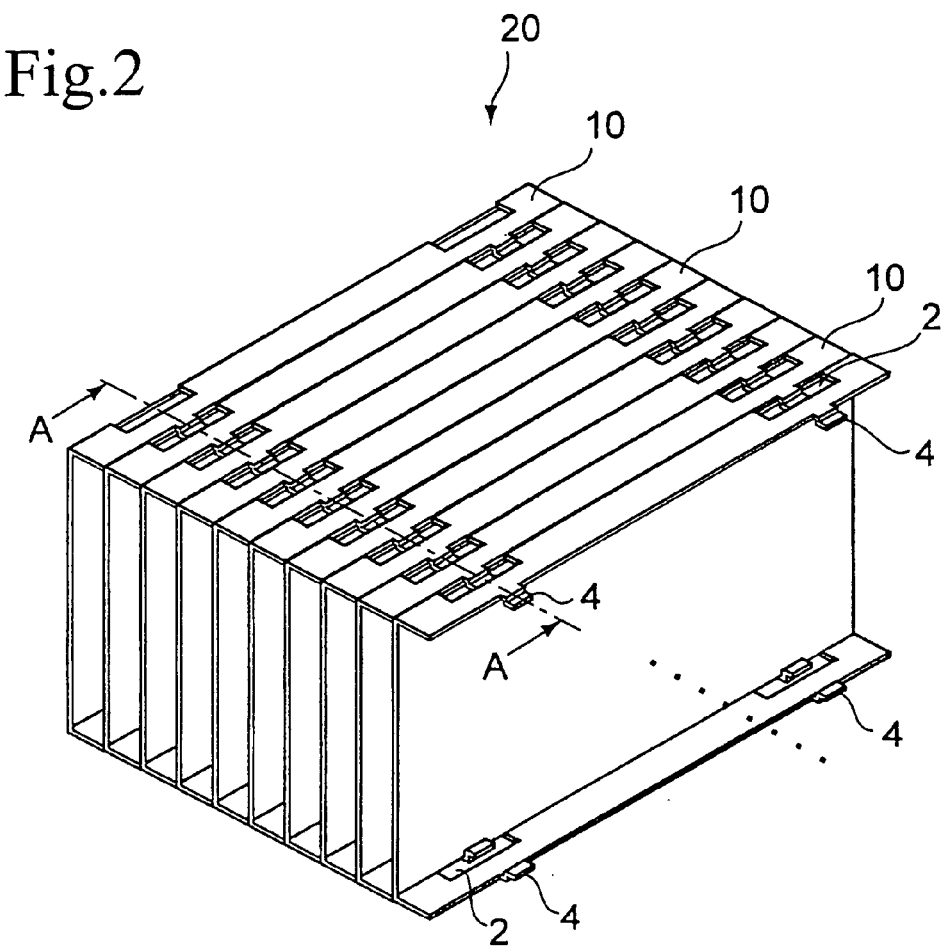
FIG. 2 is a perspective view showing a heat sink assembled by stacking a plurality of fins.
Figure 3:
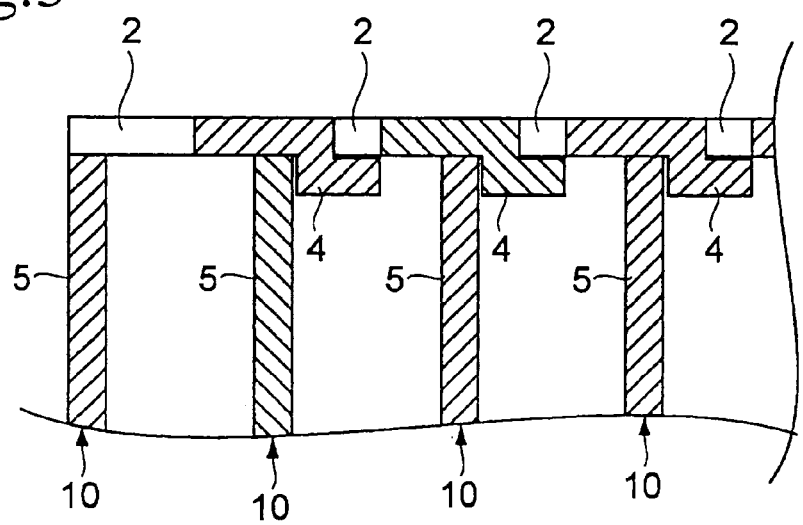
FIG. 3 is a sectional view taken along the line A-A in FIG. 2.

FIG. 2 is a perspective view showing a heat sink as a radiation fin, which is assembled by stacking a plurality of fins 10. FIG. 3 is a sectional view taken along the line A-A in FIG. 2. As shown in FIG. 2 and FIG. 3, the engage projections 4 are engaged to the engage hole portions 2 of the adjacent fins 10, and the respective fins 10 are arranged and stacked with the respective surfaces 5 of the fins 10 disposed substantially parallel with each other.

Figure 4:
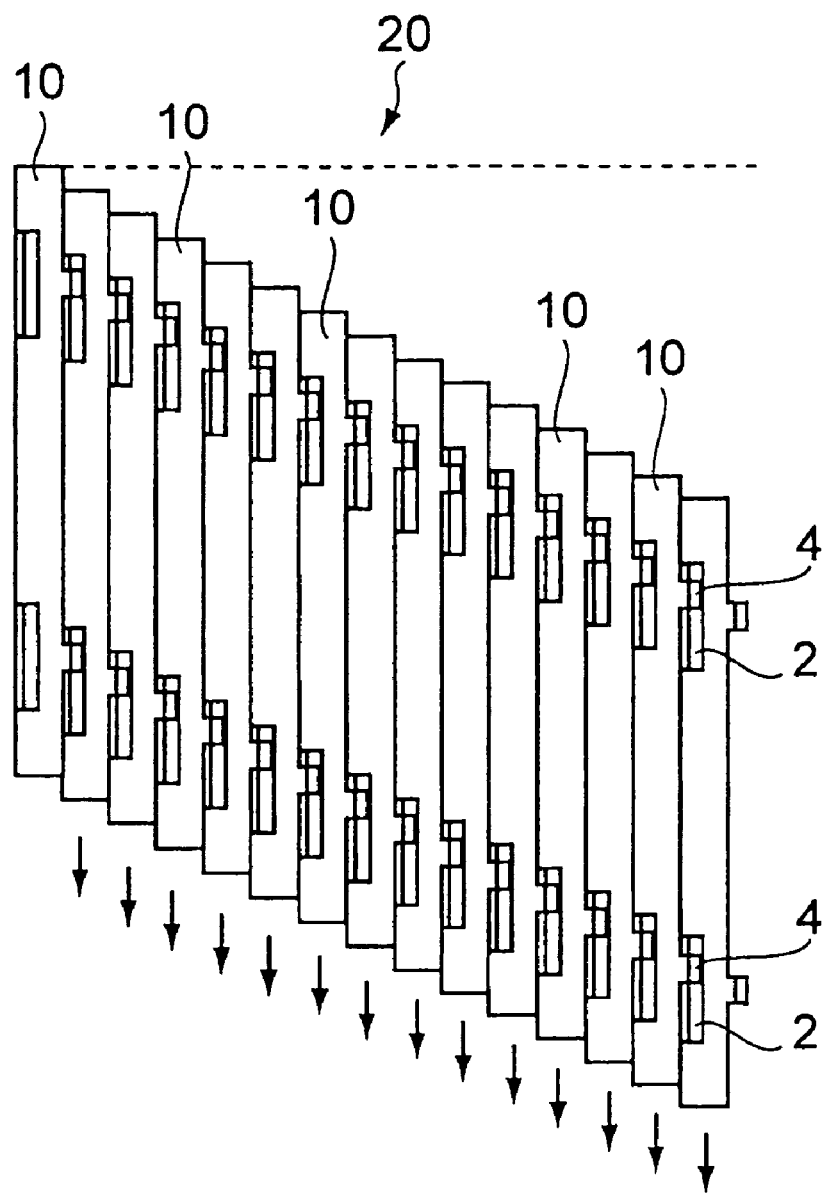
FIG. 4 is a plan view showing a heat sink with the respective fins slid.
Figure 5:
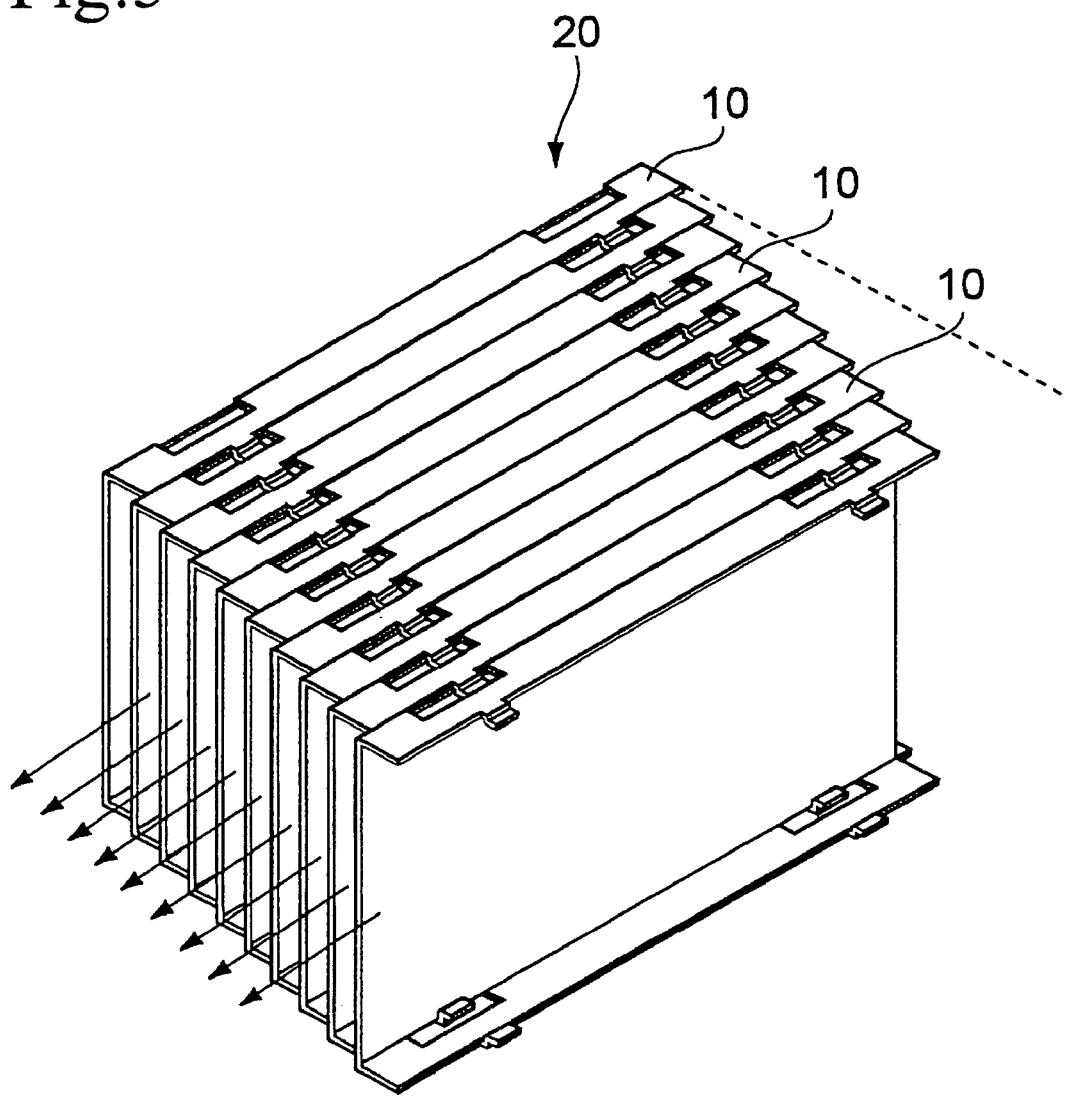
FIG. 5 is a perspective view of the heat sink shown in FIG. 4.
Figure 6:
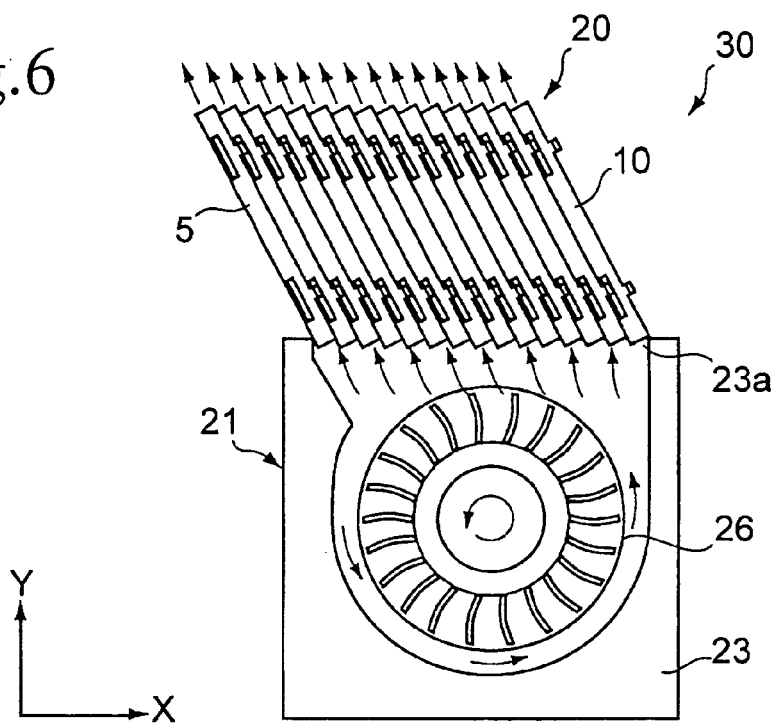
FIG. 6 is a plan view showing a cooling device in which the heat sink with the respective fins slid is attached to a fan.

FIG. 4 and FIG. 5 are a plan view and a perspective view, respectively, showing the state in which the respective fins 10 are slid when a heat sink 20 so constructed is attached to a fan. Having them so slide is possible because the width s of the engage hole portion 2 is greater than the width t of the engage projection 4, as described above. FIG. 6 is a plan view showing a cooling device in which the heat sink 20 with the respective fins 10 so slid is attached to a fan 21. The heat sink is able to be attached so as to be oriented in the direction of refrigerant flow through an impeller 26, that is, obliquely to a case 23, with the respective fins 10 slid over each other. Specifically, the heat sink is able to be attached such that the surfaces 5 of the fins 10 are oriented in the direction in which refrigerant is exhausted, and such that the surfaces 5 are set obliquely to the array direction of the fins 10 (the X direction), for example. As attaching means, heat welding, thermo compression bonding, or soldering, etc. may be employed. As refrigerant, air may be cited, for example.

Figure 21:
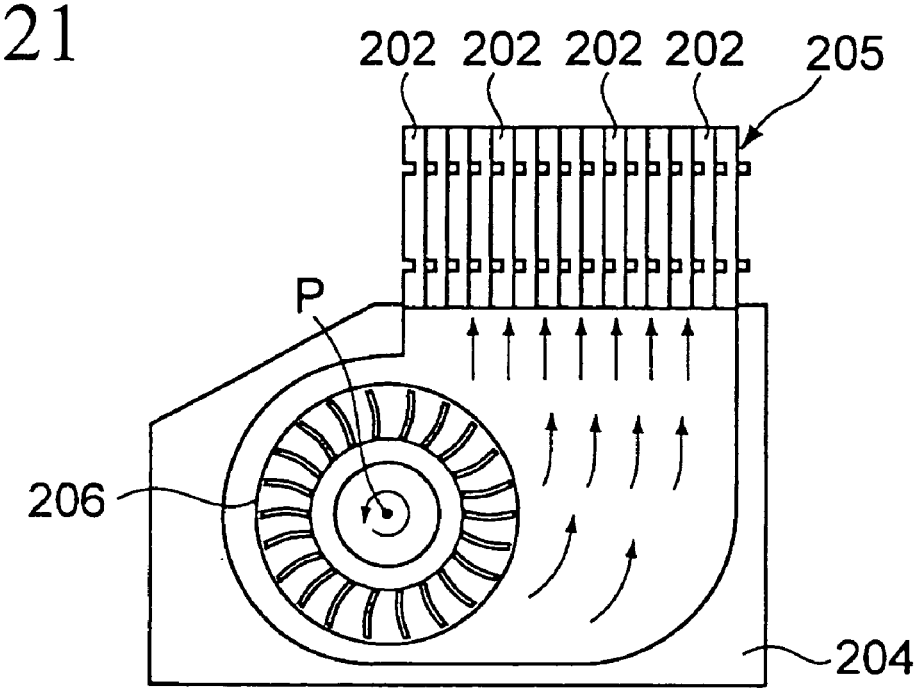
FIG. 21 is a plan view showing another conventional cooling device.
Figure 22:
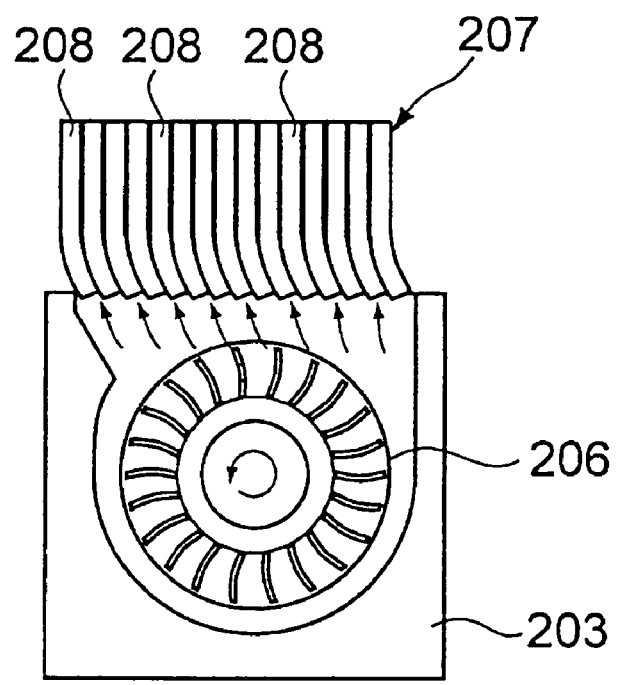
FIG. 22 is a plan view showing another conventional cooling device.

Since the resistance when refrigerant passes through between the respective fins 10 can be reduced in this preferred embodiment, the refrigerant flows smoothly, and the heat radiation efficiency of the heat sink 20 or the cooling efficiency of a cooling device 30 can be improved. Additionally, noise can be reduced because the refrigerant flows smoothly between the respective fins 10. Further, miniaturization of the fan 21 is attainable because there is no need for offsetting the installation position of a heat sink 205 with respect to a case 204, as in a conventional manner shown in FIG. 21.

Figure 7:
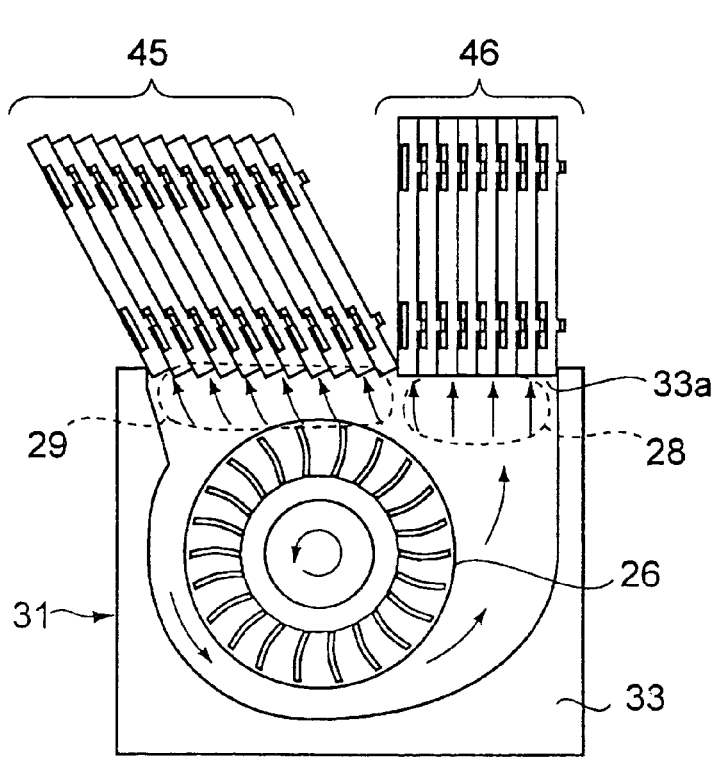
FIG. 7 is a plan view showing a modification of the cooling device shown in FIG. 6.

FIG. 7 is a plan view showing a modification of the cooling device 30 shown in FIG. 6. A fan 31 of a cooling device 40 has a case 33 of a shape different from that of the case 23 in the fan 21 shown in FIG. 6. In the case 33, the passage of refrigerant in the inside thereof is widened on the right side when viewed in the figure, as compared to the case 23 shown in FIG. 6. The refrigerant is exhausted substantially linearly from an exhaust port 33a as indicated by reference numeral 28, at the location at which the passage is widened. It is exhausted obliquely at the location indicated by reference numeral 29. To comply with these different two exhaust directions, a first fin group 45 disposed in an oblique direction to the exhaust port 33a and a second fin group 46 disposed in an orthogonal direction are attached to the case 33. Since the exhaust direction of refrigerant exhausted from the exhaust port 33a might be different for different locations, depending on the shape and the size of the impeller 26 and the case 33, a heat radiation efficiency or a cooling efficiency can be further improved by the forgoing construction of this preferred embodiment.

Figure 8:
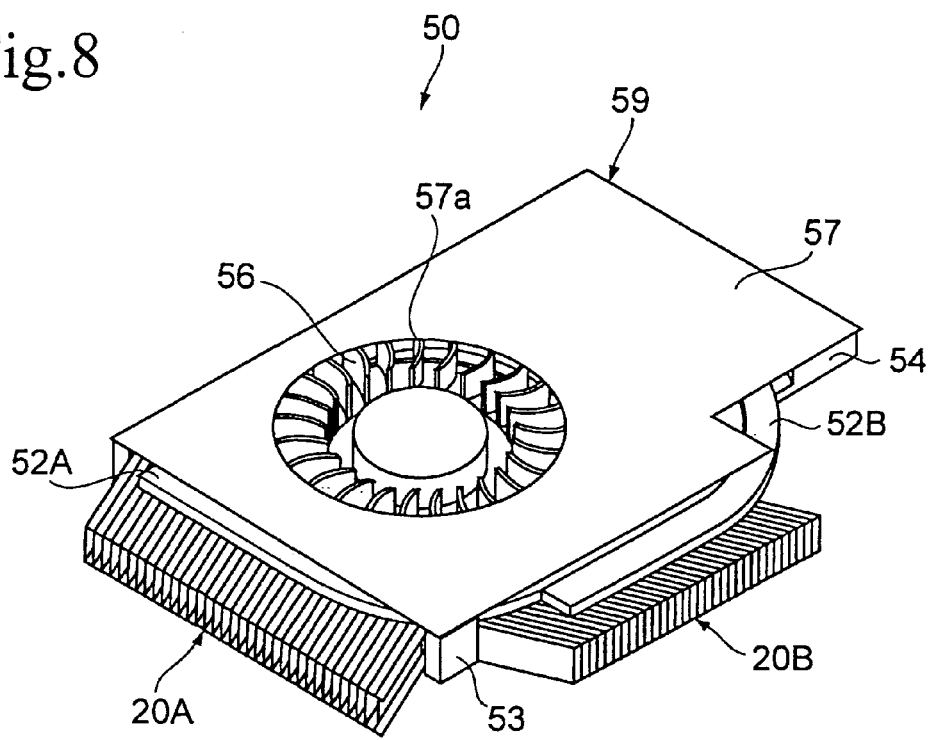
FIG. 8 is a perspective view showing a cooling device in accordance with another preferred embodiment of the present invention.
Figure 9:
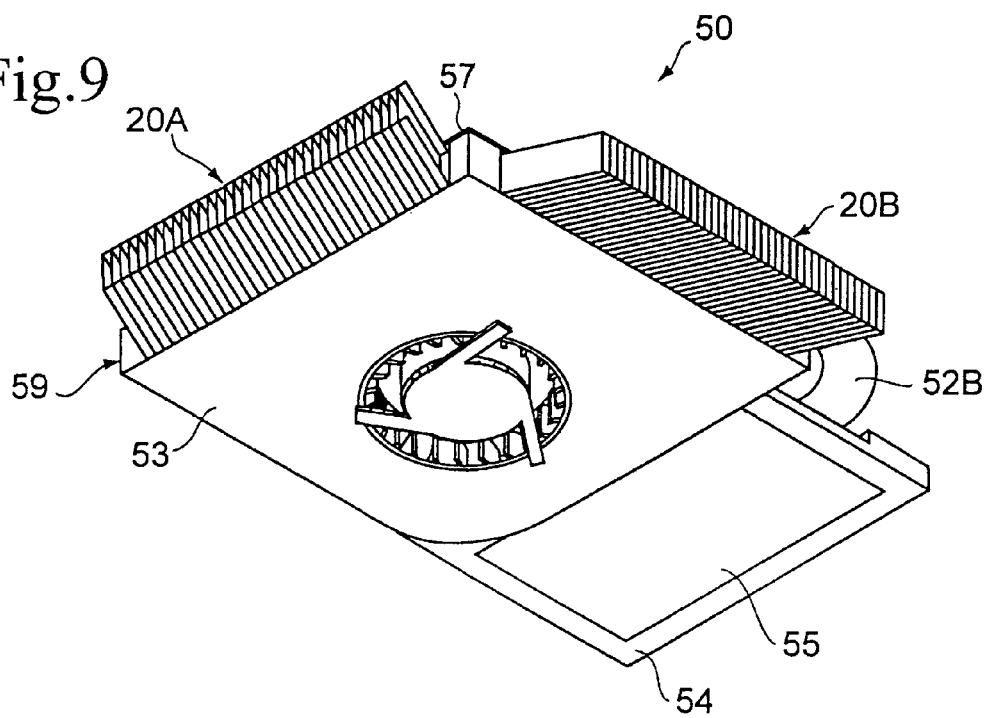
FIG. 9 is a perspective view from the backside of the cooling device shown in FIG. 8.
Figure 10:
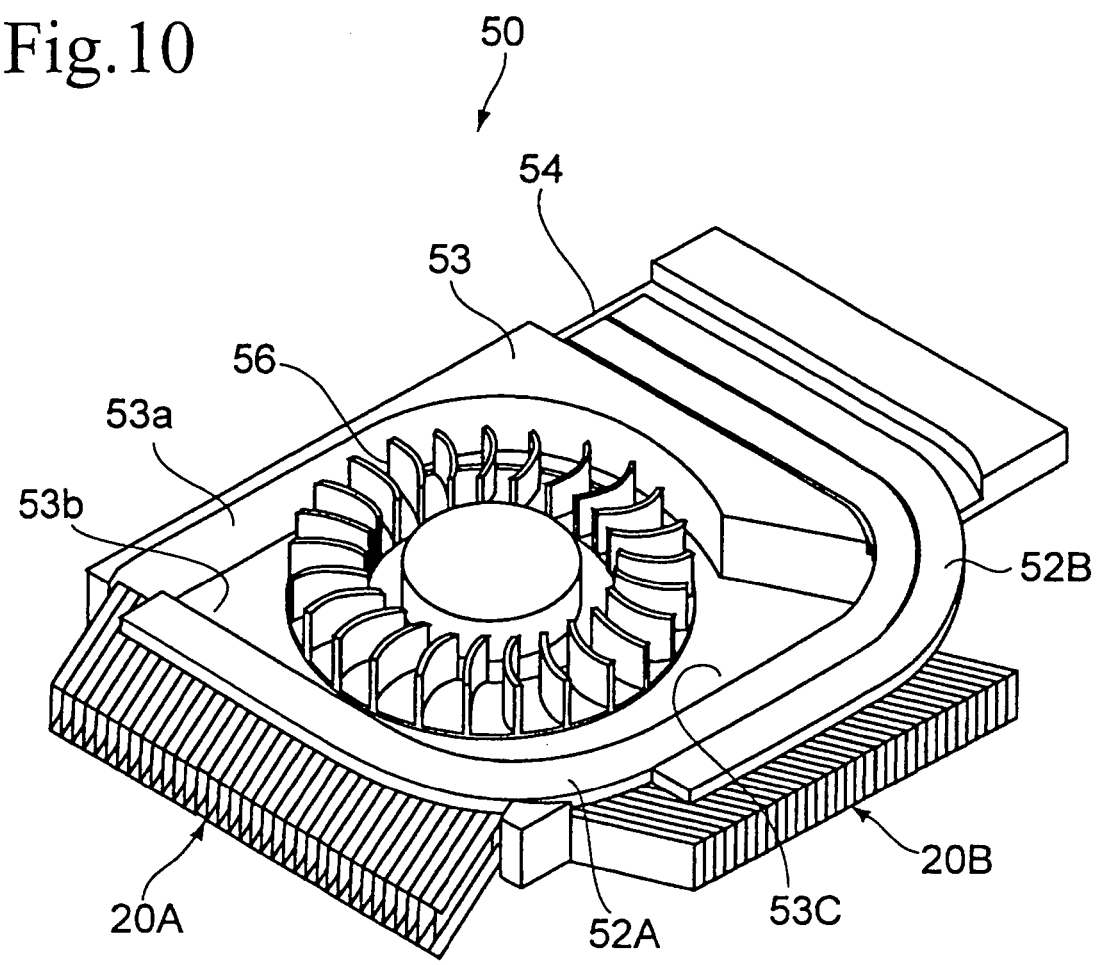
FIG. 10 is a perspective view showing the state in which a cover is removed from the case of the cooling device shown in FIG. 8.

FIG. 8 is a perspective view showing a cooling device in accordance with another preferred embodiment of the present invention. FIG. 9 is a perspective view from the backside of this cooling device. A cooling device 50 in accordance with this preferred embodiment is constructed by rotatably encasing an impeller 56 within a housing 59. The impeller 56 is rotatable by a motor (not shown), or the like. The housing 59 has a case 53, and a cover 57 attached to an upper part of the case 53. FIG. 10 is a perspective view showing the cooling device 50 with the cover 57 removed from the case 53. Formed in the case 53 is an opening 53a, through which the air in the outside is introduced into the inside of the case 53 via a suction port 57a disposed in the cover 57. In addition, for example, two exhaust ports 53b and 53c are formed in the case 53, and heat sinks 20A and 20B are attached obliquely to the exhaust ports 53b and 53c, respectively.

As for the case 53 and the cover 57, high-thermal conductance material may be used. Specifically, it is possible to use metal such as aluminum and copper, or carbon fiber that permits lightening, and the like.

A plate member 54 for heat radiation is integrally disposed in the case 53, and a heat spreader 55 is attached to the backside of the plate member 54, as shown in FIG. 9. For example, a CPU (not shown) is bonded to the heat spreader 55 with heat conductive adhesive etc. Thin type heat pipes 52A and 52B are attached to the plate member 54, and the heat sinks 20A and 20B. In the heat pipe 52A, a heat absorbing portion thereof is attached to the plate member 54, and a heat radiation portion thereof is attached to the heat sink 20A. In the heat pipe 52B, a heat absorbing portion thereof is attached to the plate member 54, and a heat radiation portion thereof is attached to the heat sink 20B.

The operation of the cooling device 50 so constructed will be described. If the CPU (not shown) generates heat, the heat is conducted via the heat spreader 55 and the plate member 54 to the heat pipes 52A and 52B. The heat is transmitted to the heat sinks 20A and 20B by the heat pipes 52A and 52B, respectively, and then dissipated by the heat sinks 20A and 20B. Further, by the rotation of the impeller 56, air is introduced from outside to the inside of the housing 59, and the air is exhausted through exhaust ports 53b and 53c. This facilitates heat radiation action of the heat sinks 20A and 20B.

A manufacturing method of the cooling device 50 will be described next. Particularly, a method of attaching the heat sinks 20A and 20B to the case 53 is described mainly.

In the heat sinks 20A and 20B, the respective fins 10 are formed by die pressing, etc., and then ejected from a manufacturing device (not shown), with the respective fins 10 stacked, namely as the heat sinks 20A and 20B. Subsequently, in the heat sinks 20A and 20B, the respective fins 10 are slid by the hands of an operator or by a device (not shown). In the slid state, namely, in the state shown in FIG. 4 or FIG. 5, they are attached to the exhaust ports 53b and 53c of the case 53 by the hands of an operator or a device (not shown). The heat sinks 20A and 20B can be fixed to the case 53 by, for example, heat welding, thermo compression bonding, or soldering, etc. Thereafter, the heat pipes 52A and 52B are attached, and the cover 57 is attached.

In this preferred embodiment, the heat sinks 20A and 20B can be attached obliquely at an arbitrary angle to the case 53. Therefore, the refrigerant flow passes through smoothly between the respective fins 10, and the heat radiation efficiency of the heat sink 20 or the cooling efficiency of the cooling device 30 can be improved, and noise can be reduced.

Additionally, to attach the heat sink 20A, etc. obliquely to the case 53 as in this preferred embodiment, traditionally, it is necessary to attach obliquely individual fins to a case. However, in this preferred embodiment the angle of the respective fins can be set obliquely to the array direction of the respective fins only by having the respective fins such as the heat sink 20A, etc. slide over each other. Therefore, after having them slide, the heat sink 20A, etc. can be attached to the case 53, thereby to facilitate manufacturing.

Figure 11:
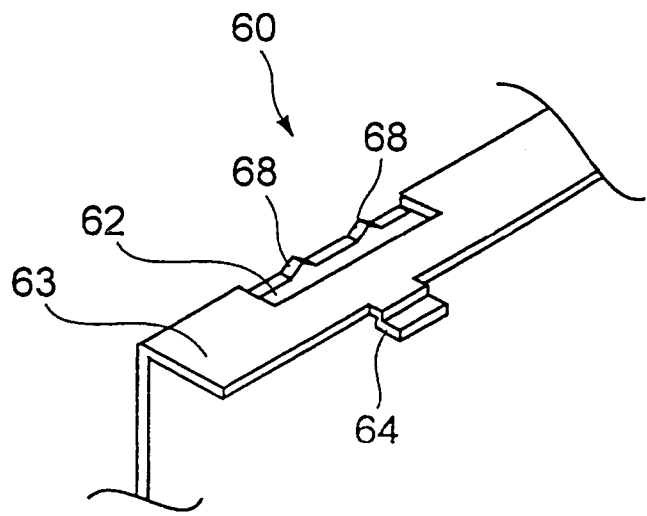
FIG. 11 is an enlarged perspective view showing an engage location of a fin in accordance with another preferred embodiment.

FIG. 11 is an enlarged perspective view showing engage locations of fins in accordance with another preferred embodiment. Four engage hole portions 62 are disposed in a bent region 63 of a fin 60 in accordance with this preferred embodiment, and four engage projections 64 also are disposed at end portions. In FIG. 11, only one engage hole portion 62 and one engage projection 64 are shown, and others are omitted. In the engage hole portion, an abutment projection 68 projecting upwardly is formed at the side surface of the fin. While there are disposed for example, two abutment projections 68, without limiting to this, there may be three or more pieces.

Figure 12:
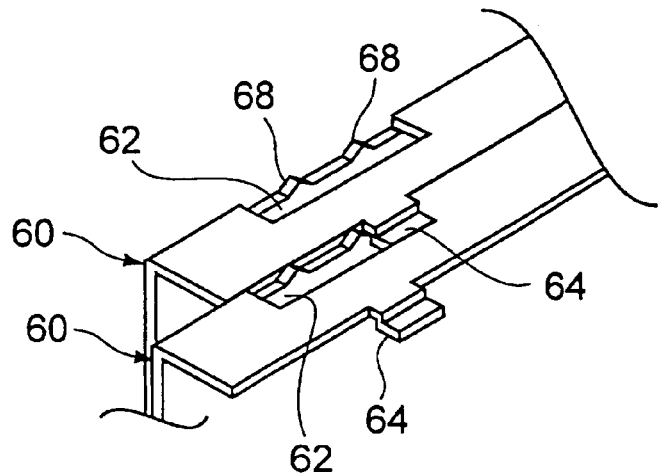
FIG. 12 is a perspective view showing the state in which the fins shown in FIG. 11 are stacked.

When the fins 60 shown in FIG. 11 are stacked, namely, when the engage projection 64 of one fin 60 is engaged to the engage hole portion 62 of other fin 60, as shown in FIG. 12, the engage projection 64 abuts the abutment projection 68. This prevents the fins 60 from sliding or separating from each other. For example, when a heat sink is attached to a fan case, the heat sink can be attached easily to the case while reliably maintaining the slide state, namely retaining the rigidity of the heat sink. In addition, by disposing two or more abutment projections 68, the angles of the fins 60 can be adjusted stepwise, thereby optimizing a cooling efficiency.

Figure 13:
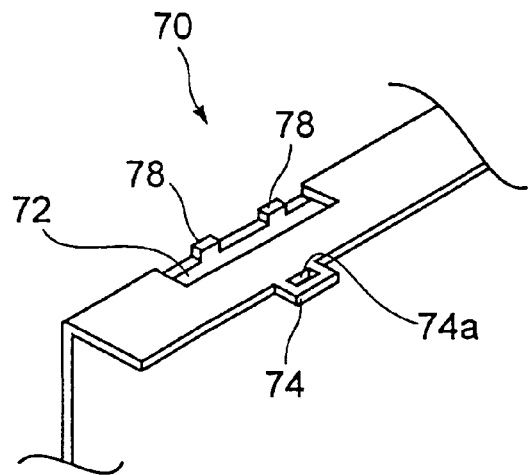
FIG. 13 is a perspective view showing a modification of the fins shown in FIG. 12.

FIG. 13 is a perspective view showing a modification of the fin shown in FIG. 12. A fin 70 has a rectangular abutment projection 78 at an engage hole portion 72. This fin 70 also has an engage projection 74, and an opening 74a is formed in the engage projection 74. It is constructed such that the abutment projection 78 of another fin 70 engages to the opening 74a. This enables a plurality of the fins 70 to be engaged to each other and also prevents the fins 70 from sliding over each other. The abutment projection 78 should not be limited to the rectangular shape, and it may be of a triangular shape as shown in FIG. 12, or a shape having a curved surface.

Figure 14:
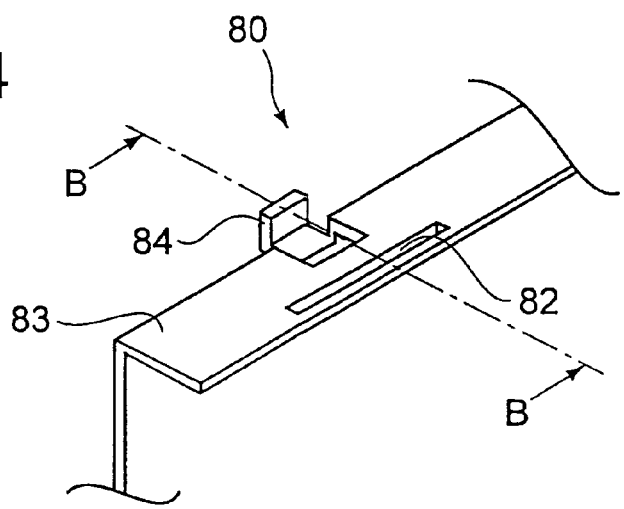
FIG. 14 is an enlarged perspective view showing an engage location of a fin in accordance with still another preferred embodiment.
Figure 15:
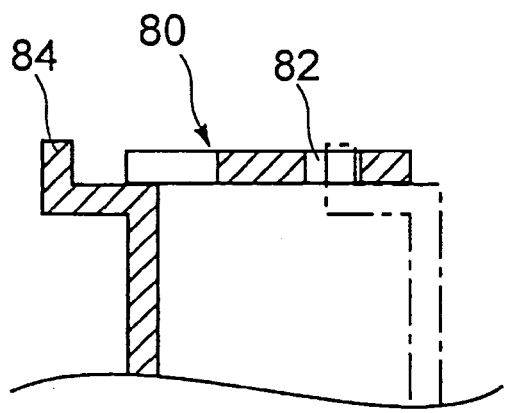
FIG. 15 is a sectional view taken along the line B-B in FIG. 14.

FIG. 14 is an enlarged perspective view showing an engage location of a fin in accordance with still another preferred embodiment. FIG. 15 is a sectional view taken along the line B-B in FIG. 14. An engage projection 84 of a fin 80 is disposed so as to project upwardly at the bending position of a bent region 83. An engage hole portion 82 disposed in a greater width than the width of the engage projection 84 is formed at the bent region 83. With this construction, the fins 80 can be slid so as to have an arbitrary angle. A plurality of the engage hole portions 82 may be disposed in the width direction.

Figure 16:
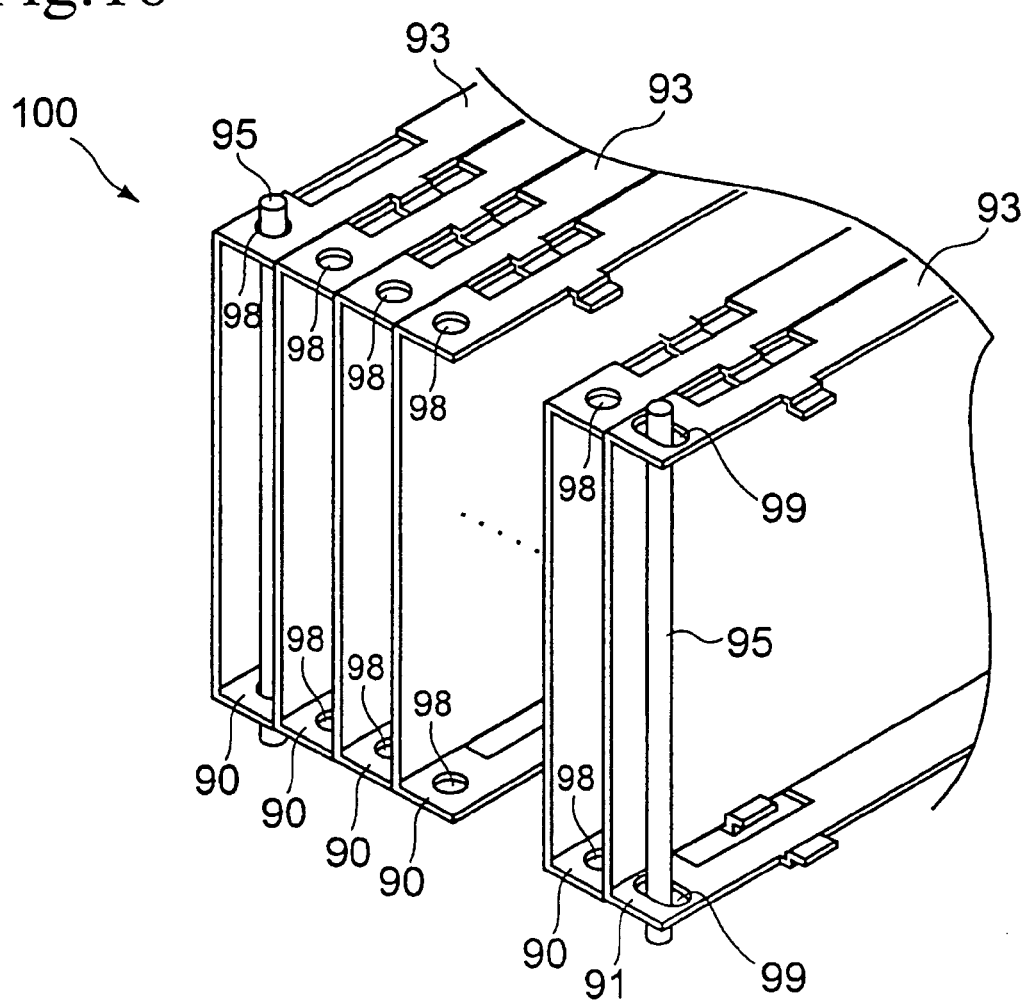
FIG. 16 is a perspective view showing part of a heat sink in accordance with still another preferred embodiment.
Figure 18:
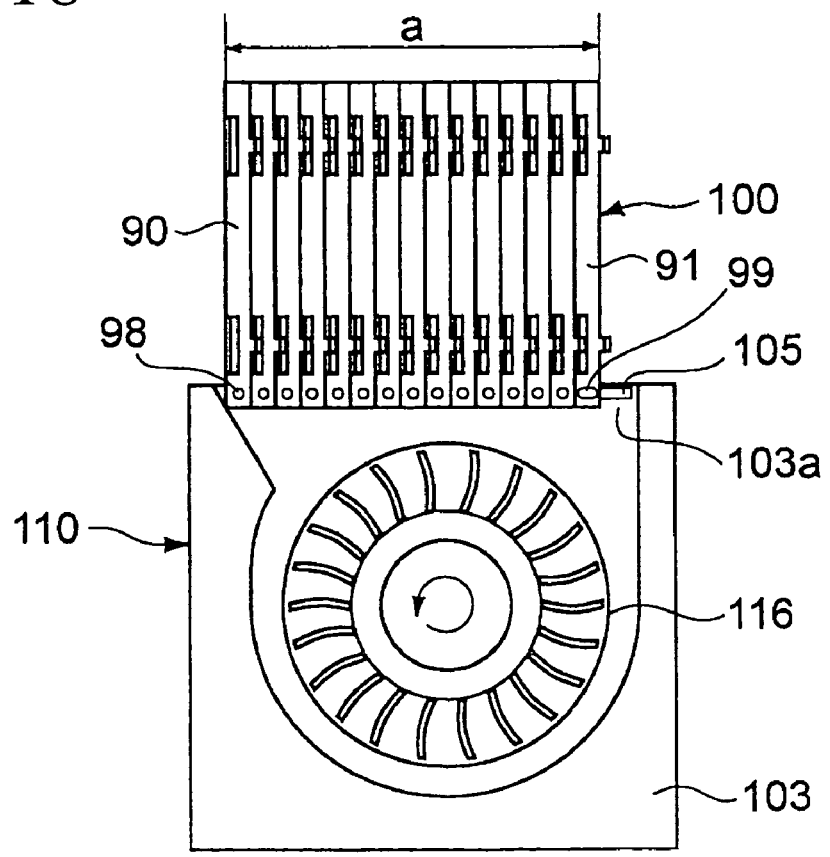
FIG. 18 is a plan view showing the state in which the heat sink shown in FIG. 16 is attached to a fan.

FIG. 16 is a perspective view showing part of a heat sink in accordance with still another preferred embodiment. In fins 90 of a heat sink 100, holes 98, through which pins 95 are inserted, are formed in the vicinity of the ends of bent regions 93, respectively, and an ellipse hole 99 is formed in the vicinity of the end of the bent region 93 of the fin 91 at the right end when viewed in the figure. The pins 95 are disposed in order to attach to a case 103 of a fan 110, as shown in FIG. 18. In other words, two pins 95 are respectively disposed vertically at both ends in the vicinity of an exhaust port 103a of a case 103, and the two pins 95 are inserted through the holes 98 and 99 of the fins at both ends of a heat sink 100, so that the heat sink 100 is attached to the case 103. The respective fins 90 sandwiched between the fins 90 and 91 at both ends are mutually in an engage state, and hence in the absence of the pin 95, they do not mutually come off the case 103.

Figure 19:
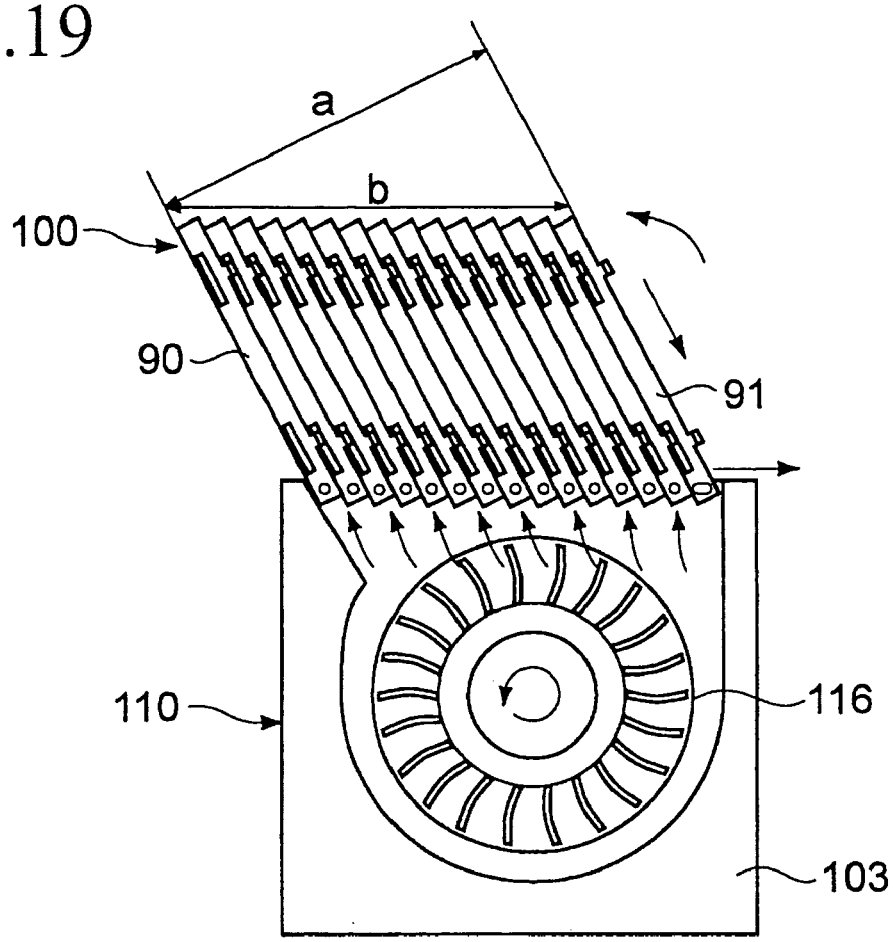
FIG. 19 is a plan view showing the state in which air flow is blown against the heat sink.
Figure 20:
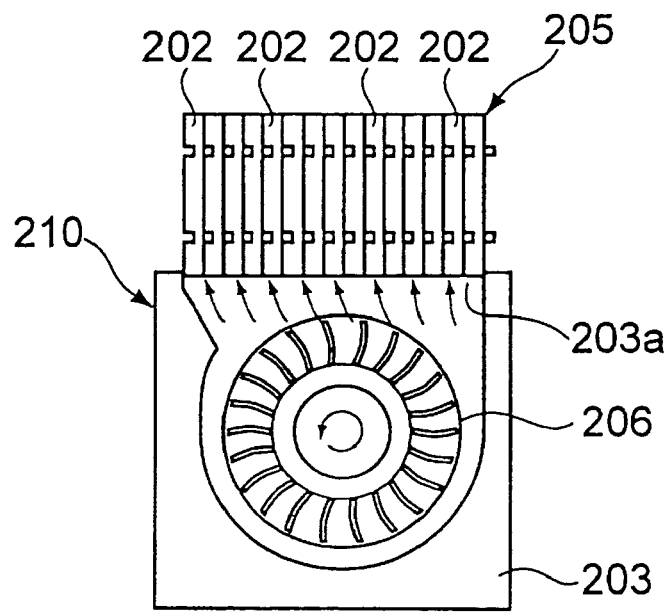
FIG. 20 is a plan view showing a conventional cooling device.

The diameter of the hole 98 is formed slightly greater than the size of the pin 95 (the diameter of cross section), so that the fin 90 is freely rotatable relative to the pin 95. Thereby, as shown in FIG. 19, the heat sink 100 rotates around the pin 95 and its direction changes so as to follow the air flow generated by the rotation of an impeller 116. In other words, the angles of the respective fins 90 are variable in response to the air flow.

Figure 17:
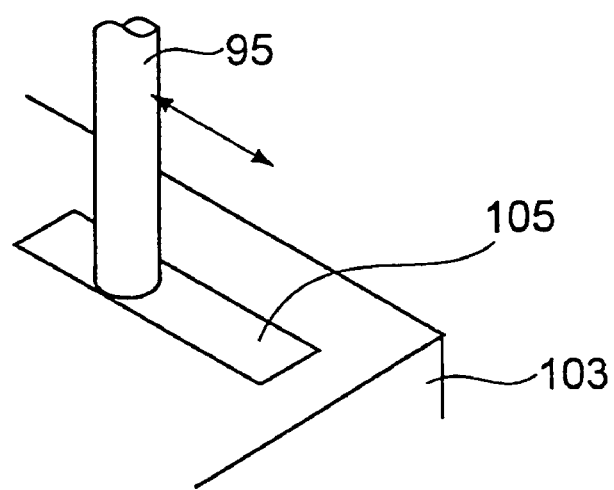
FIG. 17 is a perspective view showing a rail for allowing a pin to be removed.

Herein, the relationship between the width a of the heat sink 100 before the respective fins 90 are slid (see FIG. 18), and the width b of the heat sink 100 after they are slid (see FIG. 19) is indicated by a<b. Therefore, as shown in FIG. 17 and FIG. 18, a rail 105 may be disposed in the case 103 such that the pin 95 at the right end is removable right and left when viewed in the figure. Alternatively, when the travel amount of the heat sink 100 is small, even in the absence of the rail 105, the fin 91 is removable in the longitudinal direction of the ellipse hole 99 by the presence of the ellipse hole 99. This construction of the cooling device permits a further improvement in a cooling efficiency, and permits a reduction in noise.

The present invention should not be limited to the foregoing preferred embodiments, and various modifications are possible.

While the engage projections 4, 64, 74, and 84 in the respective foregoing preferred embodiments are in the rectangular shape, they may be of a shape having a curved surface, or a polygon shape, namely a slope shape. Alternatively, the engage projections 4, 64, 74, and 84 may be made of material having flexibility. Flexibility is realizable by having the engage projections have resiliency or by using rubber. The possession of flexibility facilitates the engagement of the engaged projections to the engage hole portions and also prevents to the utmost the respective fins from separating from each other.

While in FIG. 16, the invention is constructed to dispose the ellipse hole 99 only at the right end fin 91, it may be constructed to dispose the ellipse hole 99 at the respective fins in order to make all of the respective fins the same article. As a result, the productivity of the fins is improved. In addition, when a heat sink composed of these fins is attached to a fan case, the respective fins can be oriented obliquely and smoothly.

For example, the embodiments illustrated in the respective figures may be suitably combined to construct a fin, a heat sink, a cooling device, an electronic equipment, etc.

What is claimed is:

1. A cooling device comprising:
   a case having a suction port and an exhaust port;
   an impeller member that is encased in the case to exhaust refrigerant sucked into the case via the suction port in a first direction to outside of the case via the exhaust port; and
   a plurality of first fin groups that are arranged in the vicinity of the exhaust port and are attached to the case such that their respective surfaces are oriented in the first direction and obliquely to the direction of arrangement, fins of said first fin group each including an abutment projection that is disposed at an engage hold portion to lock said respective fins to each other while engaging an engage projection with said engage hole portion, wherein:
   each of said fins of said first group includes a plurality of engage projections having a first width, and a plurality of said engage hole portions having a second width wider than the first width, and is able to engage with said engage projections of an adjacent fin.

2. The cooling device as cited in claim 1, further comprising:
   a plurality of second fin groups, which can exhaust said refrigerant in a second direction different from the said first direction, and arranged with plural number in the vicinity of said exhaust port, and which are attached to said case such that their respective surfaces are oriented in said second direction.

3. A cooling device comprising:
   a housing having a suction port and an exhaust port;
   an impeller member that is encased in the housing to exhaust refrigerant sucked into the housing via the suction port to outside of the housing via the exhaust port; and
   a plurality of fins disposed in the vicinity of the exhaust port and are attached to the housing such that their directions are variable depending on an exhaust direction of the refrigerant, each of said fins including a plurality of engage projections disposed in a first width and a plurality of engage hole portions disposed in a second width greater than said first width, wherein said plurality of fins are stacked by engaging said engage projection with said engage hole portions of the adjacent fin, wherein each of said fins further includes an abutment projection that is disposed at said engage hole portion to lock said respective fins to each other while engaging said engage projection with said engage hole portion.

4. The cooling device as cited in claim 3, wherein;
   each of said fins varies its direction such that each surface of the fins is arranged in the exhaust direction.

* * * * *